United States Patent
Kawashima et al.

(10) Patent No.: US 11,749,609 B2
(45) Date of Patent: Sep. 5, 2023

(54) SEMICONDUCTOR DEVICE AND METHOD OF MANUFACTURING SEMICONDUCTOR DEVICE

(71) Applicant: SONY SEMICONDUCTOR SOLUTIONS CORPORATION, Kanagawa (JP)

(72) Inventors: Hiroyuki Kawashima, Kanagawa (JP); Ryoichi Nakamura, Kanagawa (JP); Yoshihisa Kagawa, Kumamoto (JP); Yuusaku Kobayashi, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/254,960

(22) PCT Filed: Jun. 11, 2019

(86) PCT No.: PCT/JP2019/023103
§ 371 (c)(1),
(2) Date: Dec. 22, 2020

(87) PCT Pub. No.: WO2020/004011
PCT Pub. Date: Jan. 2, 2020

(65) Prior Publication Data
US 2021/0183778 A1 Jun. 17, 2021

(30) Foreign Application Priority Data
Jun. 29, 2018 (JP) .................. 2018-123927

(51) Int. Cl.
*H01L 23/538* (2006.01)
*H01L 21/48* (2006.01)
*H01L 21/768* (2006.01)

(52) U.S. Cl.
CPC ........ *H01L 23/5384* (2013.01); *H01L 21/486* (2013.01); *H01L 21/76807* (2013.01); *H01L 23/5386* (2013.01)

(58) Field of Classification Search
CPC ............... H01L 23/481; H01L 23/5384; H01L 23/5383; H01L 23/486; H01L 21/76898; H01L 21/76807
See application file for complete search history.

(56) References Cited

U.S. PATENT DOCUMENTS

2003/0157748 A1* 8/2003 Kim .................. H01L 21/76831
257/E21.705
2003/0213980 A1 11/2003 Tanaka et al.
(Continued)

FOREIGN PATENT DOCUMENTS

| JP | 2008-042077 | 2/2008 |
|---|---|---|
| JP | 2009-147218 | 7/2009 |

(Continued)

OTHER PUBLICATIONS

International Search Report prepared by the Japan Patent Office dated Aug. 5, 2019, for International Application No. PCT/JP2019/023103.

*Primary Examiner* — Jaehwan Oh
*Assistant Examiner* — John M Parker
(74) *Attorney, Agent, or Firm* — SHERIDAN ROSS P.C.

(57) ABSTRACT

A semiconductor device according to an embodiment of the present disclosure includes: a first substrate including a first junction portion; and a second substrate including a second junction portion. The second junction portion is joined to the first junction portion. The first substrate further includes a first multilayer wiring layer in which one surface of a first wiring line faces a first insulating layer and another surface opposed to the one surface is in contact with a second insulating layer. The first multilayer wiring layer is electri- (Continued)

cally coupled to the first junction portion via the first insulating layer. The first wiring line is formed closest to a junction surface with the second substrate. The second insulating layer has a lower relative dielectric constant than a relative dielectric constant of the first insulating layer.

20 Claims, 12 Drawing Sheets

(56) References Cited

U.S. PATENT DOCUMENTS

| | | | |
|---|---|---|---|
| 2008/0036083 A1 | 2/2008 | Sawada et al. | |
| 2009/0121337 A1* | 5/2009 | Abe | B23K 26/0006 |
| | | | 257/E21.237 |
| 2009/0152602 A1 | 6/2009 | Akiyama | |
| 2010/0007020 A1 | 1/2010 | Takigawa | |
| 2011/0101537 A1* | 5/2011 | Barth | H01L 24/80 |
| | | | 257/E21.597 |
| 2014/0145338 A1 | 5/2014 | Fujii et al. | |
| 2015/0155323 A1* | 6/2015 | Ahn | H01L 27/14687 |
| | | | 257/184 |
| 2016/0066423 A1* | 3/2016 | Sakamoto | H01L 23/49822 |
| | | | 29/846 |
| 2018/0096915 A1* | 4/2018 | Fujii | H01L 27/14636 |
| 2020/0335543 A1* | 10/2020 | Kotoo | H01L 25/0756 |
| 2021/0104571 A1* | 4/2021 | Shohji | H01L 27/14621 |
| 2022/0013568 A1* | 1/2022 | Hayashi | H01L 27/14625 |
| 2022/0028804 A1* | 1/2022 | Mitsuhashi | H01L 24/06 |
| 2022/0238590 A1* | 7/2022 | Hiramatsu | H01L 21/768 |

FOREIGN PATENT DOCUMENTS

| | | |
|---|---|---|
| JP | 2010-021401 | 1/2010 |
| JP | 2010-045406 | 2/2010 |
| JP | 2012-256736 | 12/2012 |
| JP | 2018-092991 | 6/2018 |

* cited by examiner

SEMICONDUCTOR DEVICE AND METHOD OF MANUFACTURING SEMICONDUCTOR DEVICE

CROSS REFERENCE TO RELATED APPLICATIONS

This application is a national stage application under 35 U.S.C. 371 and claims the benefit of PCT Application No. PCT/JP2019/023103 having an international filing date of 11 Jun. 2019, which designated the United States, which PCT application claimed the benefit of Japanese Patent Application No. 2018-123927, filed 29 Jun. 2018, the entire disclosures of each of which are incorporated herein by reference.

TECHNICAL FIELD

The present disclosure relates to a semiconductor device in which semiconductor substrates are joined to each other and a method of manufacturing the semiconductor device.

BACKGROUND ART

In recent years, three-dimensionally structured semiconductor devices have been developed to decrease the size of semiconductor devices and increase the degree of integration. For example, PTL 1 discloses a three-dimensionally structured semiconductor device in which a sensor substrate including a photoelectric converter and a circuit substrate including a peripheral circuit portion are joined by CuCu junction.

CITATION LIST

Patent Literature

PTL 1: Japanese Unexamined Patent Application Publication No. 2014-187166

SUMMARY OF THE INVENTION

Incidentally, in a semiconductor device (image sensor) in which substrates are joined by CuCu junction as described above, silicon oxide ($SiO_2$) is generally used as inter-wiring materials included in wiring layers of the sensor substrate. $SiO_2$ has a higher relative dielectric constant than that of a Low-k material used in an advanced logic product, for example. $SiO_2$ tends to cause wiring lines to have greater RC delay. Therefore, semiconductor devices each having CuCu junction are required to reduce wiring delay.

It is desirable to provide a semiconductor device and a method of manufacturing a semiconductor device each of which makes it possible to reduce wiring delay.

A semiconductor device according to an embodiment of the present disclosure includes: a first substrate including a first junction portion; and a second substrate including a second junction portion. The second junction portion is joined to the first junction portion. The first substrate further includes a first multilayer wiring layer in which one surface of a first wiring line faces a first insulating layer and another surface opposed to the one surface is in contact with a second insulating layer. The first multilayer wiring layer is electrically coupled to the first junction portion via the first insulating layer. The first wiring line is formed closest to a junction surface with the second substrate. The second insulating layer has a lower relative dielectric constant than a relative dielectric constant of the first insulating layer.

A method of manufacturing a semiconductor device according to an embodiment of the present disclosure includes: forming, in order, a first multilayer wiring layer and a first junction portion to form a first substrate in which one surface of a first wiring line of the first multilayer wiring layer faces a first insulating layer and another surface opposed to the one surface is in contact with a second insulating layer; and forming a second junction portion as a second substrate and then joining the first junction portion and the second junction portion together. The first multilayer wiring layer includes the second insulating layer as an interlayer insulating layer. The first junction portion has the first insulating layer around the first junction portion. The first wiring line is formed closest to the first junction portion. The second insulating layer has a lower relative dielectric constant than a relative dielectric constant of the first insulating layer.

In the semiconductor device according to the embodiment of the present disclosure and the method of manufacturing the semiconductor device according to the embodiment, in the first substrate joined to the second substrate via the respective junction portions (first junction portion and second junction portion) provided thereto, one surface of the first wiring layer of the first multilayer wiring layer faces the first insulating layer and the other surface opposed to the one surface is in contact with the second insulating layer. The first multilayer wiring layer is electrically coupled to the first junction portion and provided with the first insulating layer interposed therebetween. The first wiring layer is formed the closest to the junction surface with the second substrate. The second insulating layer has a lower relative dielectric constant than that of the first insulating layer. All of the interlayer insulating layers of the multilayer wiring layer provided to the first substrate are thus formed by using insulating layers each having a low dielectric constant.

The semiconductor device according to the embodiment of the present disclosure and the method of manufacturing the semiconductor device according to the embodiment cause one surface of the first wiring layer of the first multilayer wiring layer to face the first insulating layer provided around the first junction surface and cause the other surface opposed to the one surface to be in contact with the second insulating layer having a lower relative dielectric constant than that of the first insulating layer. The first multilayer wiring layer is provided to the first substrate. The first wiring layer is formed the closest to the junction surface with the second substrate. This makes it possible to form all of the interlayer insulating layers of the first multilayer wiring layer by using insulating layers each having a low relative dielectric constant. It is thus possible to reduce the wiring delay in the first multilayer wiring layer provided to the first substrate.

It is to be noted that the effects described here are not necessarily limited, but any of effects described in the present disclosure may be included.

MODES FOR CARRYING OUT THE INVENTION

The following describes an embodiment of the present disclosure in detail with reference to the drawings. The following description is a specific example of the present disclosure, but the present disclosure is not limited to the following mode. In addition, the present disclosure does not also limit the disposition, dimensions, dimension ratios, and the like of respective components illustrated in the respective diagrams thereto. It is to be noted that description is given in the following order.
1. First Embodiment (Example of semiconductor device in which Low-k materials are used for all of the interlayer insulating layers of multilayer wiring layer)
1-1. Configuration of Semiconductor Device
1-2. Method of Manufacturing Semiconductor Device
1-3. Workings and Effects
2. Second Embodiment (Example of semiconductor device in which junction portion is configured as single damascene structure)
2-1. Configuration of Semiconductor Device
2-2. Method of Manufacturing Semiconductor Device
3. Modification Example 1 (Example of semiconductor device in which gap is provided in each interlayer insulating layer of the multilayer wiring layer)
4. Modification Example 2 (Example of Semiconductor Device in which DRAM is further stacked)

1. First Embodiment

Figure 1:
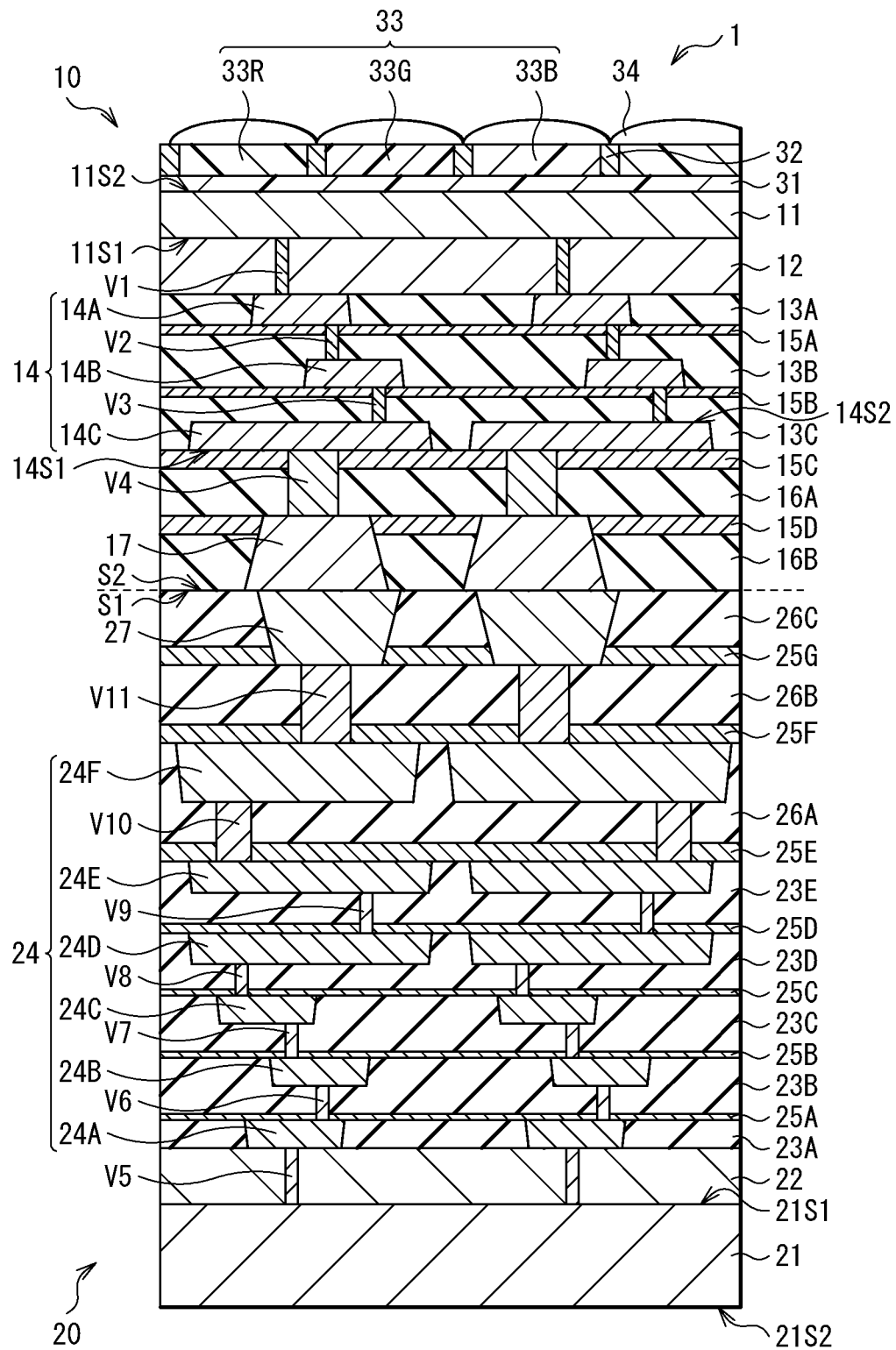
FIG. 1 is a cross-sectional schematic diagram illustrating a configuration of a semiconductor device according to a first embodiment of the present disclosure.

FIG. 1 schematically illustrates a cross-sectional configuration of a semiconductor device (semiconductor device 1) according to a first embodiment of the present disclosure. The semiconductor device 1 is obtained by joining a plurality of substrates (two substrates here) by CuCu junction. In the plurality of respective substrates, functional elements, various circuits, and the like are formed. In the semiconductor device 1 according to the present embodiment, a sensor substrate 10 (first substrate) and a logic substrate 20 (second substrate) are joined together at pad portions 17 and 27 (first junction portion and second junction portion). For example, the sensor substrate 10 (first substrate) is provided with a photodiode as a light receiving element (sensor element). For example, in the logic substrate 20 (second substrate), a logic circuit of the light receiving element is formed. The pad portions 17 and 27 are provided on a surface S1 and a surface S2 that are the respective junction surfaces of the sensor substrate 10 (first substrate) and the logic substrate 20 (second substrate).

1-1. Configuration of Semiconductor Device

The semiconductor device 1 according to the present embodiment is formed to cause a wiring line 14C (first wiring line) to have one surface (surface 14S1) face an insulating layer 16A and have the other surface (surface 14S2) face an interlayer insulating layer 13C. The wiring line 14C (first wiring line) is formed the closest to the surface S1 in a multilayer wiring layer 14 further provided to the sensor substrate 10 (first multilayer wiring layer). The multilayer wiring layer 14 is electrically coupled to the pad portion 17. The other surface (surface 14S2) is opposed to the one surface (surface 14S1).

The sensor substrate 10 is provided with the multilayer wiring layer 14 above the front surface (surface 11S1) of a semiconductor substrate 11 with an insulating layer 12 interposed therebetween. The semiconductor substrate 11 is provided, for example, with a photodiode as a light receiving section in a predetermined region included in each pixel. The photodiode has pn junction. The multilayer wiring layer 14 serves, for example, as a transmission path of charges generated by the photodiode. Above the multilayer wiring layer 14, the pad portion 17 whose surface is joined to the logic substrate 20 is provided. A light-shielding film 32, a color filter 33, and an on-chip lens 34 are provided above the back surface (surface 11S2) of the semiconductor substrate 11 with a protective layer 31 interposed therebetween, for example.

The semiconductor substrate 11 includes, for example, an n-type silicon (Si) substrate and has a p-well 61 in a predetermined region. Although not illustrated, the surface 11S1 of the semiconductor substrate 11 is provided, for example, with a floating diffusion (floating diffusion layer) FD, various transistors such as an amplifying transistor.

The insulating layer 12 is provided on the surface 11S1 of the semiconductor substrate 11. The insulating layer 12 includes, for example, a single-layer film including one of silicon oxide ($SiO_x$), silicon nitride ($SiN_x$), silicon oxynitride (SiON), and the like or a stacked film including two or more of them.

An interlayer insulating layer 13A, an interlayer insulating layer 13B, and the interlayer insulating layer 13C are provided on the insulating layer 12. The interlayer insulating layer 13A, the interlayer insulating layer 13B, and the interlayer insulating layer 13C are closer to the semiconductor substrate 11 in this order. The interlayer insulating layers 13A, 13B, and 13C respectively have wiring lines 14A, 14B, and 14C embedded therein to form the multilayer wiring layer 14. The wiring lines 14A, 14B, and 14C included in the multilayer wiring layer 14 are each formed under a wiring rule of an L/S (line and space) is 120/120 or less, for example. In addition, the wiring lines 14A, 14B, and 14C are each formed to have a thickness of 250 nm or less, for example. The interlayer insulating layers 13A, 13B, and 13C are each formed by using a material having a lower relative dielectric constant than that of each of the insulating layers 16A and 16B described below. Specifically, it is preferable that the interlayer insulating layers 13A, 13B, and 13C be each formed by using a material having a relative dielectric constant of 1.5 or more and 3.8 or less. Examples include a Low-k material. Examples of a specific Low-k material include SiOC, SiOCH, porous silica, SiOF, inorganic SOG, organic SOG, polyallyl ether, and the like. The interlayer insulating layers 13A, 13B, and 13C each include a single-layer film including one of the above-described materials or a stacked film including two or more of these materials.

The insulating layer 16A and the insulating layer 16B are provided in this order above the interlayer insulating layer 13C and the wiring line 14C exposed on the upper surface of the interlayer insulating layer 13C. The pad portion 17 is embedded in the insulating layer 16B. The pad portion 17 is exposed on the surface of the insulating layer 16B. This pad portion 17 and the insulating layer 16B form the junction surface (surface S1) with the logic substrate 20. The insulating layers 16A and 16B are each formed by using, for example, a material having a relative dielectric constant of 4.0 or more and 8.0 or less. Examples of such a material include $SiO_x$, $SiN_x$, SiON, SiC, SiCN, and the like. The insulating layers 16A and 16B each include a single-layer film including one of the above-described materials or a stacked film including two or more of these materials. It is preferable that the pad portion 17 be formed to have a total film thickness of 1 μm or more with a via V4 described below, for example.

A photodiode and the wiring line 14A provided to the semiconductor substrate 11 are coupled by a via V1. The wiring line 14A and the wiring line 14B are coupled by a via V2. The wiring line 14B and the wiring line 14C are coupled by a via V3. The wiring line 14C and the pad portion 17 are coupled by the via V4. This electrically couples the front surface (surface 11S1) of the semiconductor substrate 11 and the pad portion 17. The wiring lines 14A, 14B, and 14C, the pad portion 17, and the vias V1, V2, V3, and V4 each include, for example, a metallic material such as copper (Cu), aluminum (Al), tungsten (W), titanium (Ti), cobalt (Co), hafnium (Hf), or tantalum (Ta).

Further, there are provided diffusion preventing layers 15A, 15B, and 15C between the interlayer insulating layer 13A and the interlayer insulating layer 13B, between the interlayer insulating layer 13B and the interlayer insulating layer 13C, between the interlayer insulating layer 13C and the insulating layer 16A, respectively. The diffusion preventing layers 15A, 15B, and 15C prevent the diffusion of the metallic materials (e.g., copper (Cu)) included in the wiring lines 14A, 14B, and 14C, the vias V1, V2, V3, and V4, and the pad portion 17. The diffusion preventing layers 15A, 15B, and 15C are each formed by using, for example, SiOC, SiCN, SiC, AlNO, $AlO_x$, and the like. There is provided an interlayer insulating layer 15D between the insulating layer 16A and the insulating layer 16B.

The protective layer 31 is provided on the back surface (surface 11S2) of the semiconductor substrate 11. The protective layer 31 includes a material having light transmissivity and includes, for example, a single-layer film including any of $SiO_x$, $SiN_x$, SiON, and the like or a stacked film including two or more thereof.

The color filters 33 and the on-chip lenses 34 are provided on the protective layer 31. The color filters 33 are provided on the protective layer 31. For example, any of a red filter (33R), a green filter (33G), and a blue filter (33B) is disposed for each pixel. These color filters 33R, 33G, and 33B are provided in regular color arrangement (e.g., Bayer arrangement). Providing the color filters 33 like these allows the photodiodes provided on the semiconductor substrate 11 to obtain the respective pieces of light reception data of the colors corresponding to the color arrangement. The light-shielding films 32 are provided between the red filter (33R), the green filter (33G), and the blue filter (33B). It is to be noted that there may be provided a white filter as the color filter 33 in addition to the red filter (33R), the green filter (33G), and the blue filter (33B).

The on-chip lens 34 has a function of condensing light, for example, on the photodiode provided for each pixel. Examples of a lens material include an organic material, a silicon oxide film ($SiO_2$), and the like.

For example, a circuit (e.g., logic circuit) including, for example, a plurality of transistors is formed on the front surface (surface 21S1) of a semiconductor substrate 21 of the logic substrate 20. As an example, there is provided a multilayer wiring layer 24 above the semiconductor substrate 21 with an insulating layer 22 interposed therebetween. Above the multilayer wiring layer 24, the pad portion 27 whose surface is joined to the sensor substrate 10 is provided.

The semiconductor substrate 21 includes, for example, a silicon (Si) substrate. Although not illustrated, the semiconductor substrate 21 is provided with a transistor having, for example, a Si planar structure or a transistor such as a Fin-FET transistor having a three-dimensional structure.

The insulating layer 22 is provided on the surface 21S1 of the semiconductor substrate 21. The insulating layer 22 includes, for example, a single-layer film including one of $SiO_x$, $SiN_x$, SiON, and the like or a stacked film including two or more thereof as with the insulating layer 12.

An interlayer insulating layer 23A, an interlayer insulating layer 23B, an interlayer insulating layer 23C, an interlayer insulating layer 23D, and an interlayer insulating layer 23E are provided on the insulating layer 22. The interlayer insulating layer 23A, the interlayer insulating layer 23B, the interlayer insulating layer 23C, the interlayer insulating layer 23D, and the interlayer insulating layer 23E are closer to the semiconductor substrate 21 in this order. The interlayer insulating layers 23A, 23B, 23C, 23D, and 23E respectively have wiring lines 24A, 24B, 24C, 24D, and 24E embedded therein. The interlayer insulating layers 23A, 23B, 23C, 23D, and 23E are each formed by using a material having a lower relative dielectric constant than that of each of insulating layers 26A, 26B, and 26C described below. Specifically, it is preferable that the interlayer insulating layers 23A, 23B, 23C, 23D, and 23E be each formed by using a material having a relative dielectric constant of 1.5 or more and 3.8 or less. Examples include the above-described Low-k material. The interlayer insulating layers 23A, 23B, 23C, 23D, and 23E each include a single-layer film including one of the above-described materials or a stacked film including two or more of these materials.

The insulating layer 26A, the insulating layer 26B, and the insulating layer 26C are provided in this order above the interlayer insulating layer 23E and the wiring line 24E exposed on the upper surface of the interlayer insulating layer 23E. The insulating layer 26A has a wiring line 24F embedded therein. The insulating layer 26A forms the multilayer wiring layer 24 along with the above-described wiring lines 24A, 24B, 24C, 24D, and 24E. The pad portion 27 is embedded in the insulating layer 26C. The pad portion 27 is exposed on the surface of the insulating layer 26C. This pad portion 27 and the insulating layer 26C form the junction surface (surface S2) with the sensor substrate 10. The insulating layers 26A, 26B, and 26C are each formed by using, for example, a material having a relative dielectric constant of 4.0 or more and 8.0 or less. Examples of such a material include $SiO_x$, $SiN_x$, SiON, SiC, SiCN, and the like. The insulating layers 26A, 26B, and 26C each include a single-layer film including one of the above-described materials or a stacked film including two or more of these materials. It is preferable that the pad portion 27 be formed to have a total film thickness of 1 μm or more with a via V11 described below, for example.

Each of various transistors and the wiring line 24A provided to the semiconductor substrate 21 are coupled by a via V5. The wiring line 24A and the wiring line 24B are coupled by a via V6. The wiring line 24B and the wiring line 24C are coupled by a via V7. The wiring line 24C and the wiring line 24D are coupled by a via V8. The wiring line 24D and the wiring line 24E are coupled by a via V9. The wiring line 24E and the wiring line 24F are coupled by a via V10. The wiring line 24F and the pad portion 27 are coupled by the via V11. This electrically couples the front surface (surface 21S1) of the semiconductor substrate 21 and the pad portion 27. The wiring lines 24A, 24B, 24C, 24D, 24E, and 24F, the pad portion 27, and the vias V5, V6, V7, V8, V9, V10, and V11 each include, for example, a metallic material such as copper (Cu), aluminum (Al), tungsten (W), titanium (Ti), cobalt (Co), hafnium (Hf), or tantalum (Ta).

Further, there are respectively provided diffusion preventing layers 25A, 25B, 25C, 25D, 25E, and 25F between the interlayer insulating layer 23A and the interlayer insulating layer 23B, between the interlayer insulating layer 23C and the interlayer insulating layer 23D, between the interlayer insulating layer 23D and the interlayer insulating layer 23E, between the interlayer insulating layer 23E and the insulating layer 26A, and between the insulating layer 26A and the insulating layer 26B. The diffusion preventing layers 25A, 25B, 25C, 25D, 25E, and 25F prevent the diffusion of metallic materials (e.g., copper (Cu)) included in the wiring lines 24A, 24B, 24C, 24D, and 24E, the vias V1, V2, V3, V4, V5, V6, V7, V8, V9, V10, and V11, and the pad portion 27. The diffusion preventing layers 25A, 25B, 25C, 25D, 25E, and 25F are each formed by using, for example, SiOC, SiCN, SiC, AlNO, $AlO_x$, and the like. There is provided an interlayer insulating layer 25G between the insulating layer 26B and the insulating layer 26C.

The sensor substrate 10 and the logic substrate 20 are joined together with the pad portion 17 and the pad portion 27 interposed therebetween. The pad portion 17 and the pad portion 27 are respectively provided on the surface S1 and the surface S2 that are junction surfaces. This electrically couples the front surface (surface 11S1) of the semiconductor substrate 11 and the front surface (surface 21S1) of the semiconductor substrate 21.

1-2. Method of Manufacturing Semiconductor Device

It is possible to manufacture the semiconductor device 1 according to the present embodiment, for example, as follows.

Figure 2A:
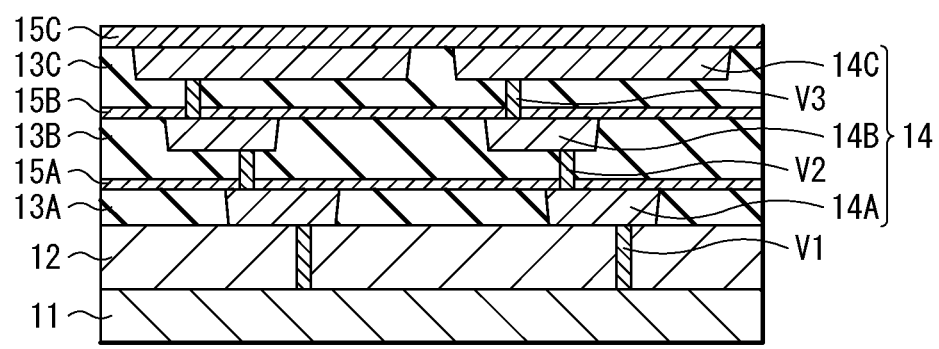
FIG. 2A is a cross-sectional schematic diagram for describing a method of manufacturing the semiconductor device illustrated in FIG. 1.

FIGS. 2A to 2E illustrate the method of manufacturing the semiconductor device 1 in order of steps. First, as illustrated in FIG. 2A, after photodiodes are formed on the semiconductor substrate 11 by using a common process, a $SiO_x$ film is, for example, formed on the semiconductor substrate 11 as the insulating layer 12. Subsequently, the via V1, the interlayer insulating layer 13A, the wiring line 14A, the diffusion preventing layer 15A, the via V2, the interlayer insulating layer 13B, the wiring line 14B, the diffusion preventing layer 15B, the via V3, the interlayer insulating layer 13C, the wiring line 14C, and the diffusion preventing layer 15C are formed in this order by using, for example, a Cu wiring process. Here, the interlayer insulating layers 13A, 13B, and 13C are formed by using, for example, SiOC. The wiring lines 14A, 14B, and 14C are each formed under a wiring rule of a thickness of 250 nm or less, for example, and an L/S (line and space) of 120/120 or less, for example. The diffusion preventing layers 15A, 15B, and 15C are each formed to have a thickness of 30 nm by using, for example, SiC.

Figure 2B:
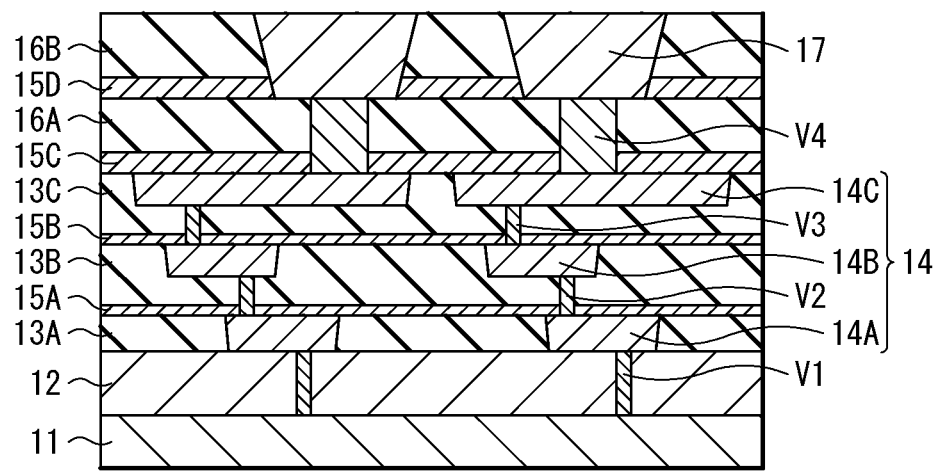
FIG. 2B is a cross-sectional schematic diagram illustrating a step subsequent to FIG. 2A.

Next, as illustrated in the FIG. 2B, the insulating layer 16A, the via V4, the interlayer insulating layer 15D, the insulating layer 16B, and the pad portion 17 are formed on the diffusion preventing layer 15C by using a common dual damascene wiring method. Here, the insulating layer 16A is formed to have a thickness of 600 nm by using, for example, $SiO_x$. The interlayer insulating layer 15D is formed to have a thickness of 400 nm by using, for example, $SiN_x$. The insulating layer 16B is formed to have a thickness of 250 nm by using, for example, $SiO_x$. The interlayer insulating layer 15D is usable as an etching stopper film at the time of formation of the pad portion 17. The via V4 is formed to have a thickness of 850 nm, for example. The pad portion 17 is formed to have a thickness of 500 nm, for example. This causes the pad portion 17 and the via V4 to have a total film thickness of 1 μm or more, securing the mechanical strength.

Figure 2C:
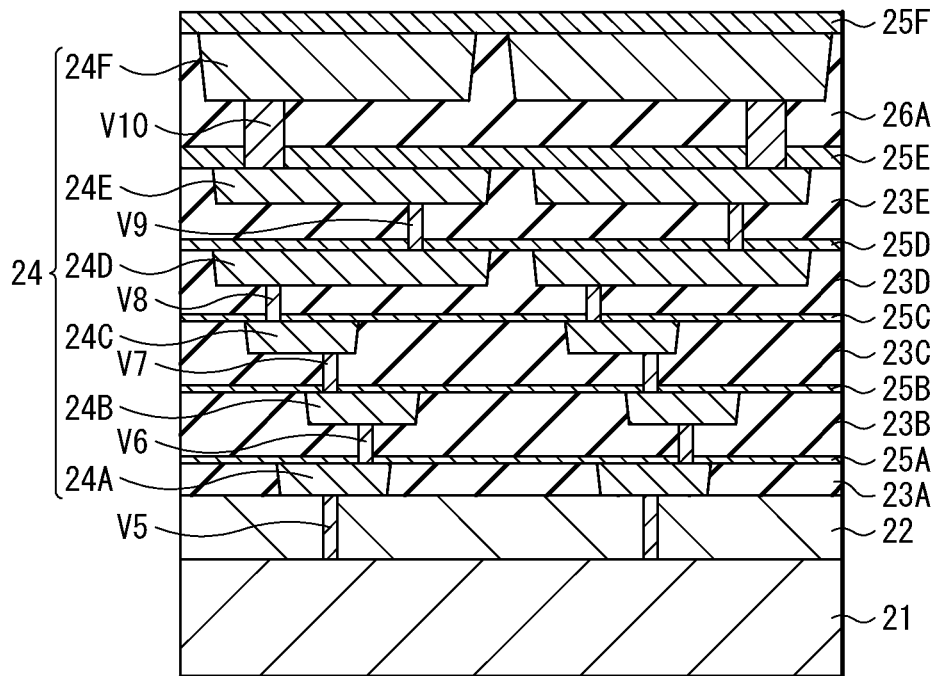
FIG. 2C is a cross-sectional schematic diagram illustrating a step subsequent to FIG. 2B.

In addition, as illustrated in FIG. 2C, after various transistors are formed on the semiconductor substrate 21 by using a common process, a $SiO_x$ film is, for example, formed on the semiconductor substrate 21 as the insulating layer 22. Subsequently, the via V5, the interlayer insulating layer 23A, the wiring line 24A, the diffusion preventing layer 25A, the via V6, the interlayer insulating layer 23B, the wiring line 24B, the diffusion preventing layer 25B, the via V7, the interlayer insulating layer 23C, the wiring line 24C, the diffusion preventing layer 25C, the via V8, the interlayer insulating layer 23D, the wiring line 24D, the diffusion preventing layer 25D, the via V9, the interlayer insulating layer 23E, the wiring line 24E, the diffusion preventing layer 25E, the via V10, the insulating layer 26A, the wiring line 24F, and the diffusion preventing layer 25F are formed in order by using, for example, a W wiring process or a Cu wiring process. Here, the interlayer insulating layers 23A, 23B, 23C, 23D, and 23E are formed by using, for example, SiOC. The wiring lines 24A, 24B, 24C, 24D, and 24E are each formed under a wiring rule of a thickness of 250 nm or less, for example, and an L/S (line and space) of 120/120 nm or less, for example. The diffusion preventing layers 25A, 25B, 25C, 25D, and 25E are each formed to have a thickness of 30 nm by using, for example, SiC. The insulating layer 26A is formed to have a thickness of 1500 nm by using, for example, $SiO_x$. The diffusion preventing layer 25E is formed to have a thickness of 50 nm by using, for example, $SiN_x$. The via V10 is formed to have a thickness of 600 nm, for example.

Figure 2D:
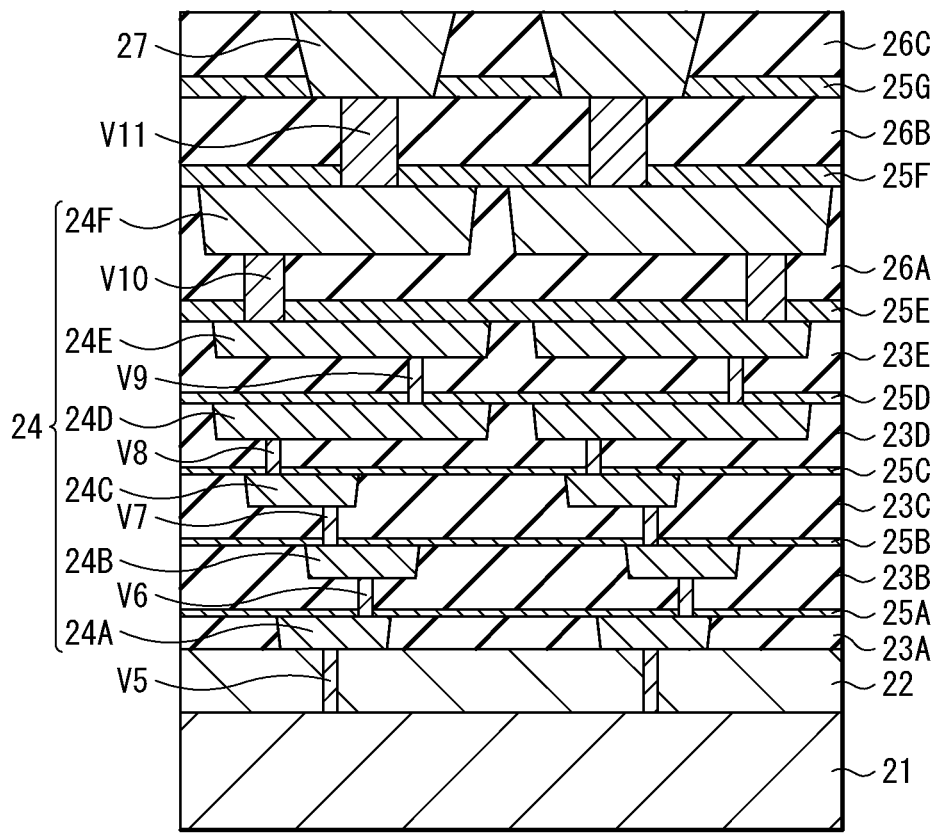
FIG. 2D is a cross-sectional schematic diagram illustrating a step subsequent to FIG. 2C.

Next, as illustrated in the FIG. 2D, the insulating layer 26B, the via V11, the interlayer insulating layer 25G, the insulating layer 26C, and the pad portion 27 are formed on the diffusion preventing layer 25F by using a common dual damascene wiring method. Here, the insulating layer 26B is formed to have a thickness of 600 nm by using, for example, $SiO_x$. The interlayer insulating layer 25G is formed to have a thickness of 400 nm by using, for example, $SiN_x$. The insulating layer 26C is formed to have a thickness of 250 nm by using, for example, $SiO_x$. The interlayer insulating layer 25G is usable as an etching stopper film at the time of formation of the pad portion 27. The via V11 is formed to have a thickness of 850 nm, for example. The pad portion 27 is formed to have a thickness of 500 nm, for example. This causes the pad portion 27 and the via V11 to have a total film thickness of 1 μm or more, securing the mechanical strength.

Figure 2E:
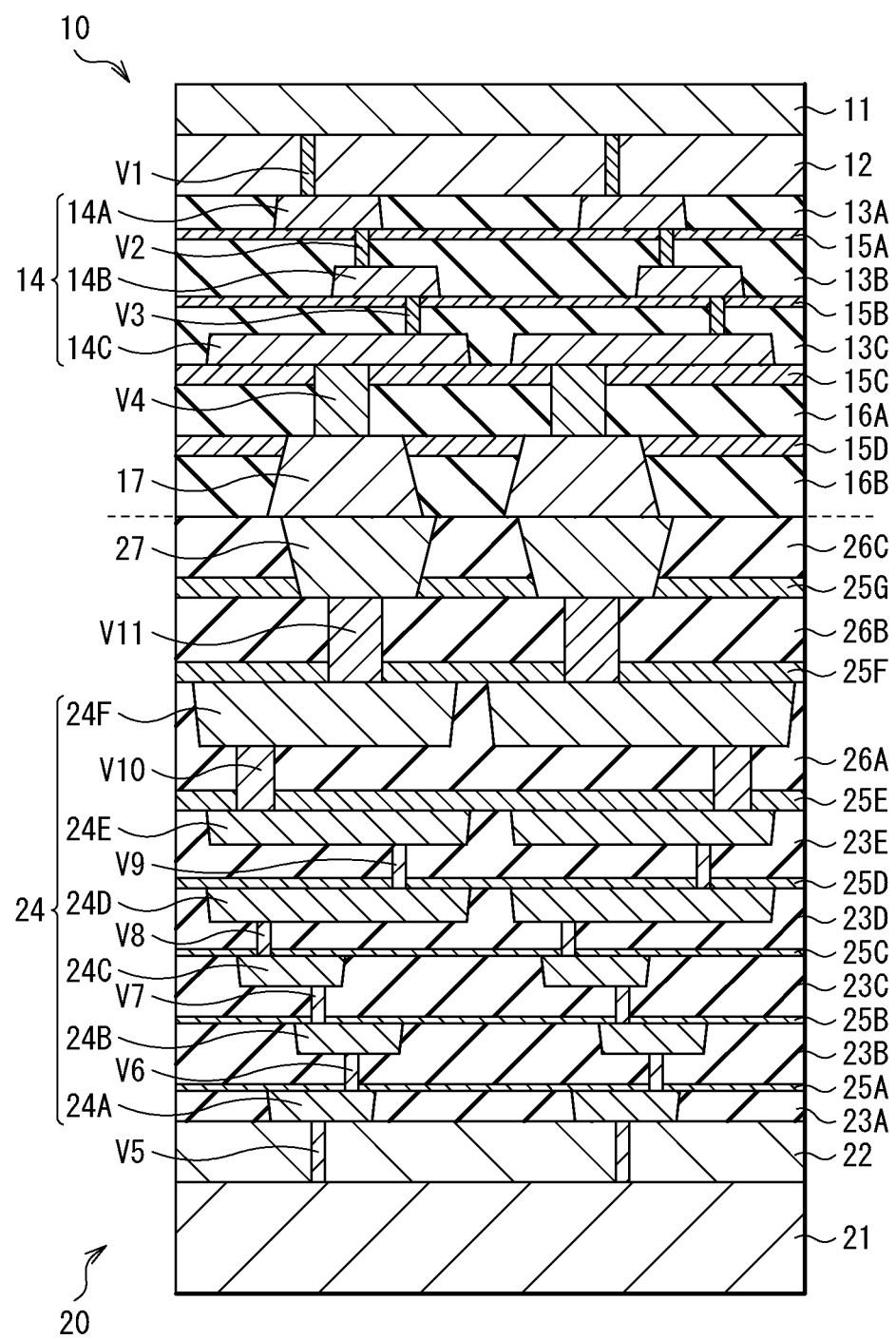
FIG. 2E is a cross-sectional schematic diagram illustrating a step subsequent to FIG. 2D.

Subsequently, as illustrated in FIG. 2E, plasma activation treatment is performed on the junction surface (surface S1) of the sensor substrate 10 formed by using the insulating layer 16B and the pad portion 17 and the junction surface (surface S2) of the logic substrate 20 formed by using the insulating layer 26C and the pad portion 27. Next, after the junction surface (surface S1) of the sensor substrate 10 and the junction surface (surface S2) of the logic substrate 20 are temporarily joined together, the junction surfaces are subjected to annealing treatment at 380° C. for about 2 hours for CuCu junction to join the sensor substrate 10 and the logic substrate 20 together. Afterward, the semiconductor substrate 11 is reduced to about 3 μm in thickness by combining a common back grinding process and chemical mechanical polishing (Chemical Mechanical Polishing; CMP). Finally, the protective layer 31, the light-shielding film 32, the color filter 33, and the on-chip lens 34 are formed in order. This completes the semiconductor device 1 illustrated in FIG. 1.

1-3. Workings and Effects

As described above, in recent years, three-dimensionally structured semiconductor devices have been developed to decrease the size of semiconductor devices and increase the degree of integration. For example, an image sensor has been reported that has a sensor substrate and a circuit substrate joined by CuCu junction. The sensor substrate includes a photoelectric conversion section. The circuit substrate includes a peripheral circuit portion. In the image sensor having CuCu junction, generally, a film between wiring layers of the sensor substrate is formed by using a $SiO_2$ film. $SiO_2$ has a higher relative dielectric constant than that of a Low-k film used in an advanced logic product, for example. $SiO_2$ tends to cause wiring lines to have greater RC delay.

In a case where the wiring lines in the image sensor have greater RC delay, the photoelectric conversion efficiency and the settling characteristics may decrease. As a method of improving the wiring delay, a method of forming a film between the wiring layers of the sensor substrate by using a Low-k film is considered. However, in a case where the films between the wiring layers of the sensor substrate are all formed by using Low-k films, films may be peeled off from the CuCu junction because of insufficient mechanical strength while the semiconductor substrate is reduced in thickness.

In contrast, in the semiconductor device 1 according to the present embodiment, the upper surface (surface 14S1 on the junction surface (surface S1) side) of the wiring line 14C of the multilayer wiring layer 14 provided the closest to the junction surface (surface S1) faces the diffusion preventing layer 15C including a $SiN_x$ film and the insulating layer 16A including a $SiO_2$ film. The lower surface (surface 14S2 opposed to the surface 14S1) of the wiring line 14C is in contact with the interlayer insulating layer 13C including a Low-k film. In other words, the interlayer insulating layers between the wiring lines 14A to 14C included in the multilayer wiring layer 14 provided to the sensor substrate 10 are each formed by using a Low-k material. The pad portion 17 included in the CuCu junction and the insulating layers 16A and 16B between the pad portion 17 and the wiring line 14C provided in the uppermost layer of the multilayer wiring layer 14 are each formed by using, for example, a $SiO_2$ material. This allows the interlayer insulating layers 13A to 13C included in the multilayer wiring layer 14 to be all formed by using Low-k films each having a low relative dielectric constant. In addition, the insulating layers 16A and 16B included in the junction surface (surface S1) each include, for example, a $SiO_2$ material offering high mechanical strength. This allows the mechanical strength of the junction surface to be secured.

As described above, in the semiconductor device 1 according to the present embodiment, the interlayer insulating layers 13A to 13C included in the multilayer wiring layer 14 are all formed by using Low-k films each having a low relative dielectric constant. This allows the wiring delay in the sensor substrate 10 to be reduced. In addition, the insulating layers 16A and 16B included in the junction surface (surface S1) are each formed by using an insulating material such as a $SiO_2$ material offering high mechanical strength. It is thus possible to reduce the occurrence of film peeling or the like.

It is to be noted that the pad portions 17 and 27 are each formed in the present embodiment by using a dual damascene wiring method. It is thus possible to form dummy pad portions on the junction surfaces (surface S1 and surface S2) of the sensor substrate 10 and the logic substrate 20. Disposing dummy pads facilitates a Cu film to be formed that has uniform density. For example, it is possible to increase the performance of planarizing the junction surfaces by CMP or the like. This makes it possible to reduce the generation of voids at the junction portions, thereby enabling stable CuCu junction.

Next, a second embodiment and modification examples (modification examples 1 and 2) are described. It is to be noted that components corresponding to those of the semiconductor device 1 according to the above-described first embodiment are denoted with the same symbols for description.

2. Second Embodiment

Figure 3:
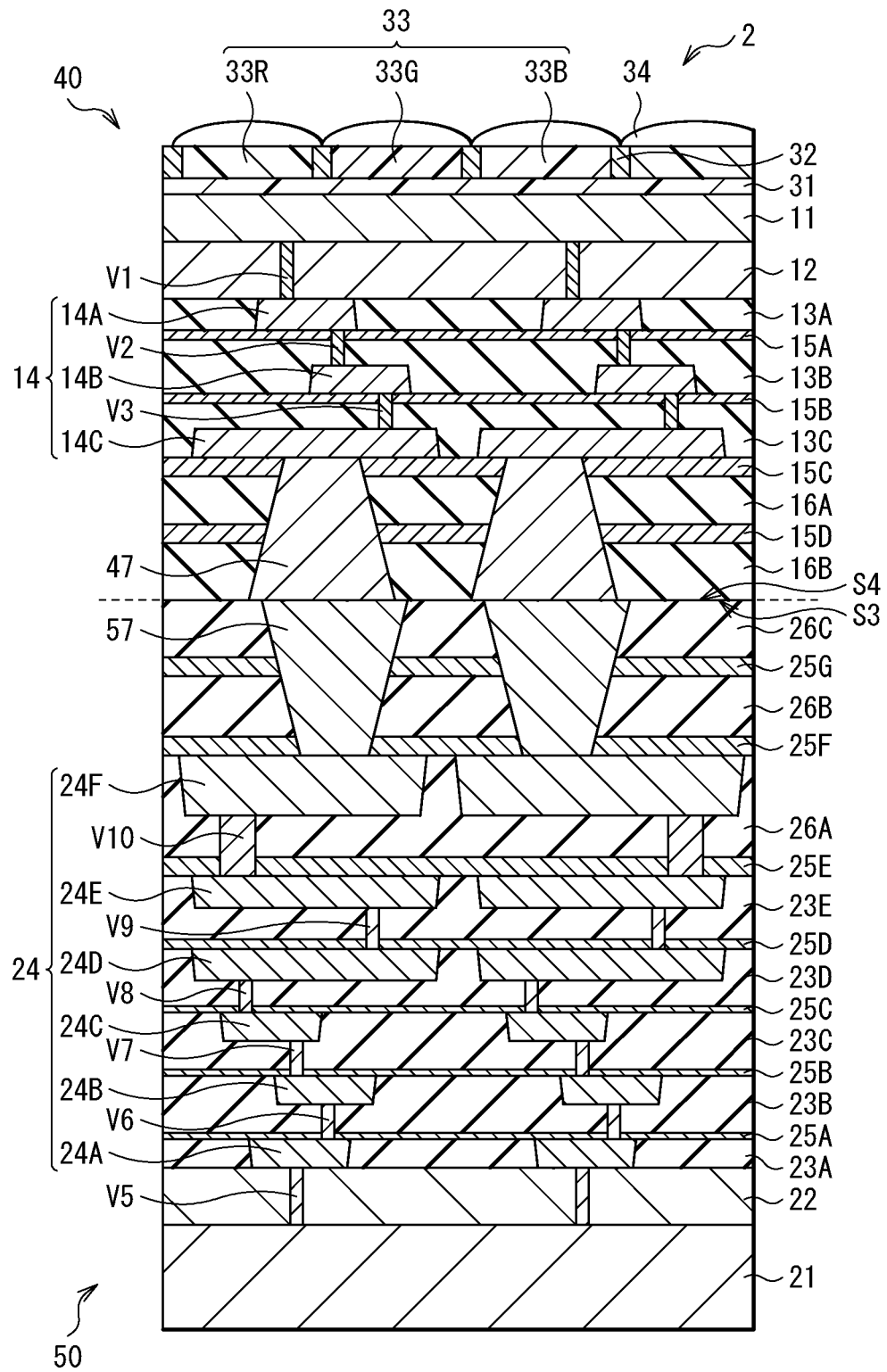
FIG. 3 is a cross-sectional schematic diagram illustrating a configuration of a semiconductor device according to a second embodiment of the present disclosure.

FIG. 3 schematically illustrates a cross-sectional configuration of a semiconductor device (semiconductor device 2) according to a second embodiment of the present disclosure. As with the semiconductor device 1 according to the above-described first embodiment, the semiconductor device 2 is obtained by joining a plurality of substrates (two substrates here) by CuCu junction. In the plurality of respective substrates, functional elements, various circuits, and the like are formed. The semiconductor device 2 according to the present embodiment is different from the first embodiment in that pad portions 47 and 57 included in the CuCu junction are each formed by using a single damascene wiring method. The pad portions 47 and 57 are respectively provided to a sensor substrate 40 and a logic substrate 50.

2-1. Configuration of Semiconductor Device

The semiconductor device 2 is obtained by joining the sensor substrate 40 and the logic substrate 50 together at the pad portions 47 and 57. The sensor substrate 40 is provided, for example, with a photodiode as a light receiving element. In the logic substrate 50, for example, a logic circuit is formed. The pad portions 47 and 57 are provided on a surface S3 and a surface S4 that are the respective junction surfaces.

The sensor substrate 40 is provided with the multilayer wiring layer 14 above the front surface (surface 11S1) of a semiconductor substrate 11 with an insulating layer 12 interposed therebetween. The semiconductor substrate 11 is provided, for example, with a photodiode as a light receiving section in a predetermined region included in each pixel. The photodiode has pn junction. The multilayer wiring layer 14 serves, for example, as a transmission path of charges generated by the photodiode. Above the multilayer wiring layer 14, the pad portion 47 whose surface is joined to the logic substrate 50 is provided. This pad portion 47 forms the junction surface (surface S3) along with the insulating layer 16B provided therearound. The light-shielding film 32, the color filter 33, and the on-chip lens 34 are provided above the back surface (surface 11S2) of the semiconductor substrate 11 with the protective layer 31 interposed therebetween, for example.

The pad portion 47 is exposed on the surface of the insulating layer 16B. The pad portion 47 forms the junction surface (surface S3) with the logic substrate 50 along with the insulating layer 16B. The pad portion 47 penetrates the diffusion preventing layer 15C provided on the wiring line 14C included in the multilayer wiring layer 14 and the interlayer insulating layer 13C, the insulating layer 16A, the interlayer insulating layer 15D, and the insulating layer 16B and is electrically coupled to the wiring line 14C directly. As with the wiring lines 14A, 14B, and 14C, and the vias V1, V2, V3, and V4, it is preferable that the pad portion 47 include, for example, a metallic material such as copper (Cu), aluminum (Al), tungsten (W), titanium (Ti), cobalt (Co), hafnium (Hf), or tantalum (Ta). Here, the pad portion 47 is formed by using Cu. It is preferable that the pad portion 47 be formed to be 1 μm or more, for example.

For example, a circuit (e.g., logic circuit) including, for example, a plurality of transistors is formed on the front surface (surface 21S3) of the semiconductor substrate 21 of the logic substrate 50. As an example, the multilayer wiring layer 24 is provided above the semiconductor substrate 21 with the insulating layer 22 interposed therebetween. Above the multilayer wiring layer 24, the pad portion 57 whose surface is joined to the sensor substrate 40 is provided. This pad portion 57 forms the junction surface (surface S4) along with the insulating layer 26C provided therearound.

The pad portion 57 is exposed on the surface of the insulating layer 26C. The pad portion 57 forms the junction surface (surface S4) with the sensor substrate 40 along with the insulating layer 26C. The pad portion 57 penetrates the diffusion preventing layer 25F provided on the wiring line 24F included in the multilayer wiring layer 24 and the insulating layer 26A, the insulating layer 26B, the interlayer insulating layer 25G, and the insulating layer 26C and is electrically coupled to the wiring line 24F directly. As with the wiring lines 24A, 24B, 24C, 24D, 24E, and 24F and the vias V5, V6, V7, V8, V9, and V10, it is preferable that the pad portion 57 include, for example, a metallic material such as copper (Cu), aluminum (Al), tungsten (W), titanium (Ti), cobalt (Co), hafnium (Hf), or tantalum (Ta). Here, the pad portion 57 is formed by using Cu. It is preferable that the pad portion 57 be formed to be 1 μm or more, for example.

2-2. Method of Manufacturing Semiconductor Device

It is possible to manufacture the semiconductor device 2 according to the present embodiment, for example, as follows.

Figure 4A:
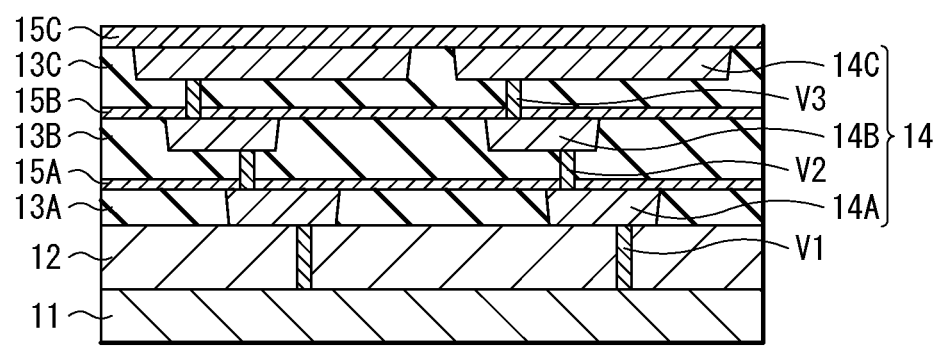
FIG. 4A is a cross-sectional schematic diagram for describing the method of manufacturing the semiconductor device illustrated in FIG. 1.

FIGS. 4A to 4E illustrate the method of manufacturing the semiconductor device 2 in order of steps. First, as illustrated in FIG. 4A, after photodiodes are formed on the semiconductor substrate 11 by using a common process, a $SiO_x$ film is, for example, formed on the semiconductor substrate 11 as the insulating layer 12. Subsequently, the via V1, the interlayer insulating layer 13A, the wiring line 14A, the diffusion preventing layer 15A, the via V2, the interlayer insulating layer 13B, the wiring line 14B, the diffusion preventing layer 15B, the via V3, the interlayer insulating layer 13C, the wiring line 14C, and the diffusion preventing layer 15C are formed in this order by using, for example, a W wiring process or a Cu wiring process. Here, the interlayer insulating layers 13A, 13B, and 13C are formed by using, for example, SiOC. The wiring lines 14A, 14B, and 14C are each formed under a wiring rule of a thickness of 250 nm or less, for example, and an L/S (line and space) of 120/120 nm or less, for example. The diffusion preventing layers 15A, 15B, and 15C are each formed to have a thickness of 30 nm by using, for example, SiC.

Figure 4B:
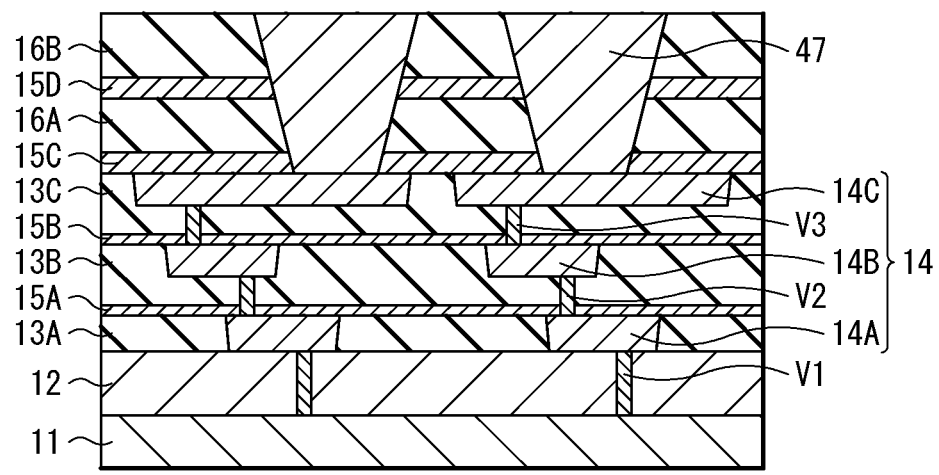
FIG. 4B is a cross-sectional schematic diagram illustrating a step subsequent to FIG. 4A.

Next, as illustrated in FIG. 4B, after the insulating layer 16A, the interlayer insulating layer 15D, and the insulating layer 16B are formed on the diffusion preventing layer 15C in order, a through hole reaching the wiring line 14C is formed by using a common single damascene wiring method. Subsequently, for example, the through hole is filled with Cu to form the pad portion 47. Here, the insulating layer 16A is formed to have a thickness of 600 nm by using, for example, $SiO_x$. The interlayer insulating layer 15D is formed to have a thickness of 400 nm by using, for example, $SiN_x$. The insulating layer 16B is formed to have a thickness of 250 nm by using, for example, $SiO_x$. The diffusion preventing layer 15C is usable as an etching stopper film at the time of formation of the pad portion 47. The pad portion 47 is formed to have a thickness of 1 μm or more, for example. This secures the mechanical strength of the junction surface with the logic substrate 50 and the area therearound.

Figure 4C:
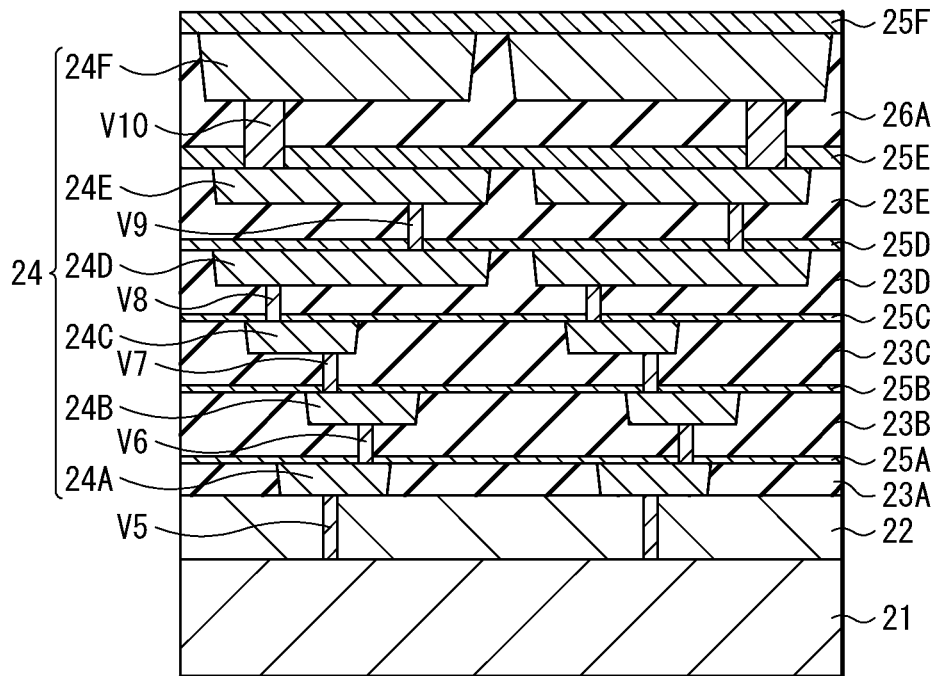
FIG. 4C is a cross-sectional schematic diagram illustrating a step subsequent to FIG. 4B.

In addition, as illustrated in FIG. 4C, after various transistors are formed on the semiconductor substrate 21 by using a common process, a $SiO_x$ film is, for example, formed on the semiconductor substrate 21 as the insulating layer 22. Subsequently, the via V5, the interlayer insulating layer 23A, the wiring line 24A, the diffusion preventing layer 25A, the via V6, the interlayer insulating layer 23B, the wiring line 24B, the diffusion preventing layer 25B, the via V7, the interlayer insulating layer 23C, the wiring line 24C, the diffusion preventing layer 25C, the via V8, the interlayer insulating layer 23D, the wiring line 24D, the diffusion preventing layer 25D, the via V9, the interlayer insulating layer 23E, the wiring line 24E, the diffusion preventing layer 25E, the via V10, the insulating layer 26A, the wiring line 24F, and the diffusion preventing layer 25F are formed in order by using, for example, a W wiring process or a Cu wiring process. Here, the interlayer insulating layers 23A, 23B, 23C, 23D, and 23E are formed by using, for example, SiOC. The wiring lines 24A, 24B, 24C, 24D, and 24E are each formed under a wiring rule of a thickness of 250 nm or less, for example, and an L/S (line and space) of 120/120 nm or less, for example. The diffusion preventing layers 25A, 25B, 25C, 25D, and 25E are each formed to have a thickness of 30 nm by using, for example, SiC. The insulating layer 26A is formed to have a thickness of 1500 nm by using, for example, $SiO_x$. The diffusion preventing layer 25E is formed to have a thickness of 50 nm by using, for example, $SiN_x$. The via V10 is formed to have a thickness of 600 nm, for example.

Figure 4D:
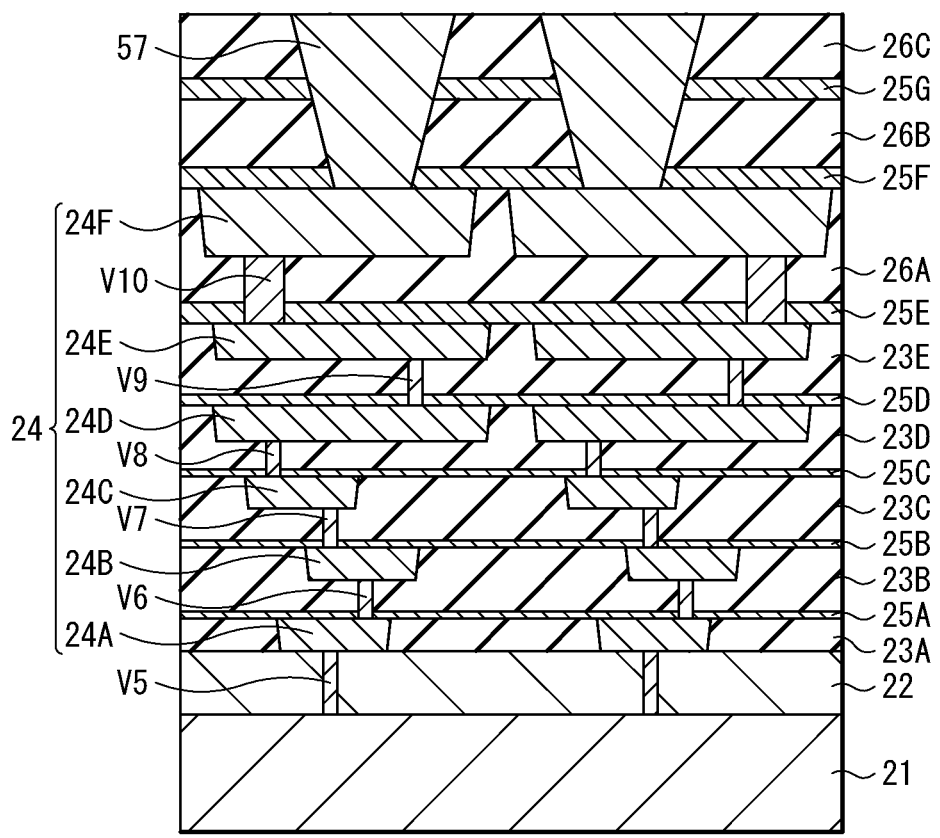
FIG. 4D is a cross-sectional schematic diagram illustrating a step subsequent to FIG. 4C.

Next, as illustrated in FIG. 4D, after the insulating layer 26B, the interlayer insulating layer 25G, and the insulating layer 26C are formed on the diffusion preventing layer 25F in order, a through hole reaching the wiring line 24F is formed by using a common single damascene process. Subsequently, for example, the through hole is filled with Cu to form the pad portion 57. Here, the insulating layer 26B is formed to have a thickness of 600 nm by using, for example, $SiO_x$. The interlayer insulating layer 25G is formed to have a thickness of 400 nm by using, for example, $SiN_x$. The insulating layer 26C is formed to have a thickness of 250 nm by using, for example, $SiO_x$. The diffusion preventing layer 25F is usable as an etching stopper film at the time of formation of the pad portion 57. The pad portion 57 is formed to have a thickness of 1 μm or more, for example. This secures the mechanical strength of the junction surface with the sensor substrate 40 and the area therearound.

Figure 4E:
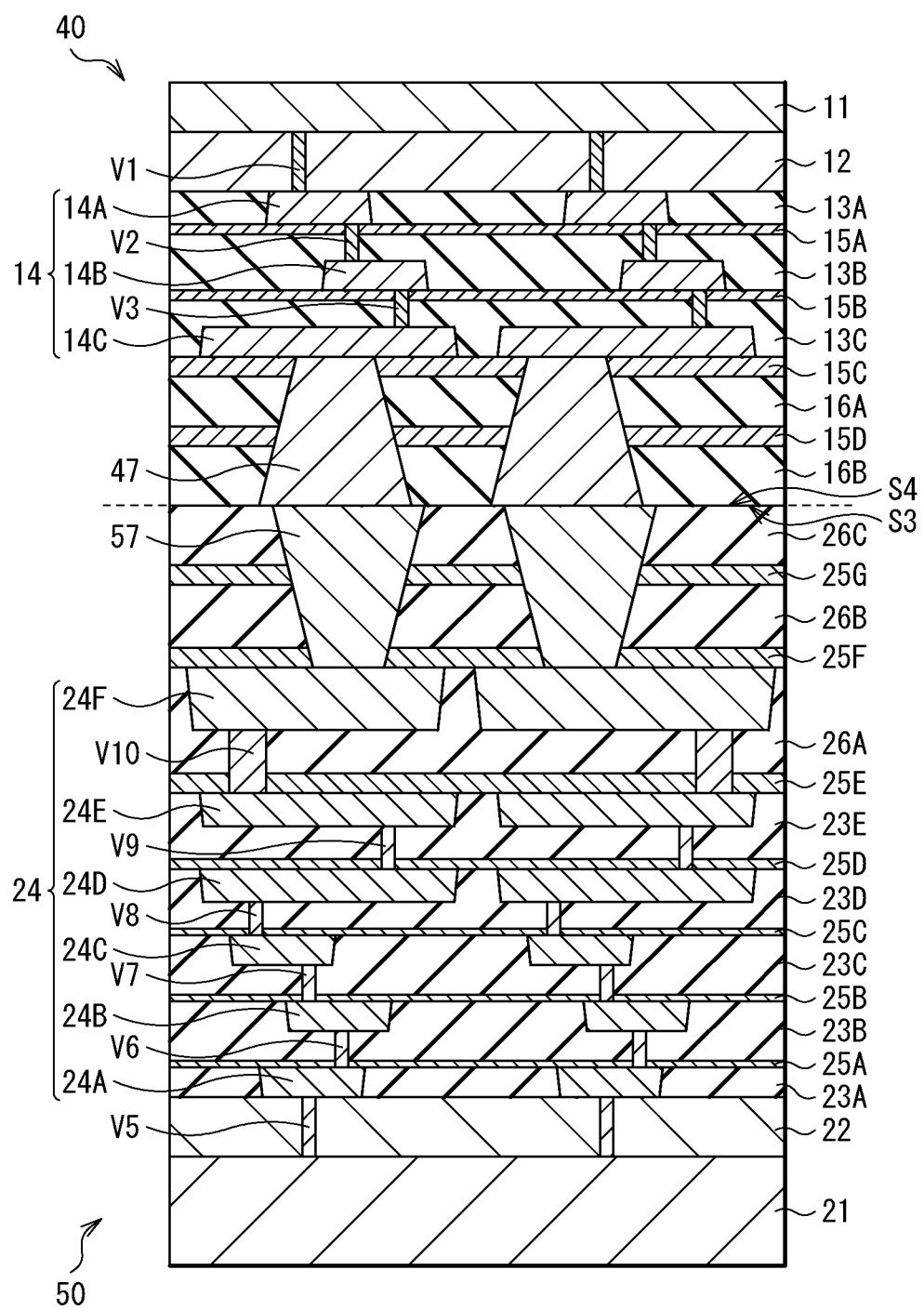
FIG. 4E is a cross-sectional schematic diagram illustrating a step subsequent to FIG. 4D.

Subsequently, as illustrated in FIG. 4E, plasma activation treatment is performed on the junction surface (surface S3) of the sensor substrate 40 formed by using the insulating layer 16B and the pad portion 47 and the junction surface (surface S4) of the logic substrate 20 formed by using the insulating layer 26C and the pad portion 57. Next, after the junction surface (surface S3) of the sensor substrate 40 and the junction surface (surface S4) of the logic substrate 50 are temporarily joined together, the junction surfaces are subjected to annealing treatment at 380° C. for about 2 hours for CuCu junction to bond the sensor substrate 40 and the logic substrate 50 together. Afterward, the semiconductor substrate 11 is reduced to about 3 μm in thickness by combining a common back grinding process and CMP. Finally, the protective layer 31, the light-shielding film 32, the color filter 33, and the on-chip lens 34 are formed in order. This completes the semiconductor device 2 illustrated in FIG. 3.

As described above, in the semiconductor device 2 according to the present embodiment, the pad portions 47 and 57 included in the CuCu junction are formed by using a single damascene wiring method. This makes it possible to reduce the number of manufacturing steps as compared with those of the semiconductor device 1 according to the first embodiment.

3. Modification Example 1

Figure 5:
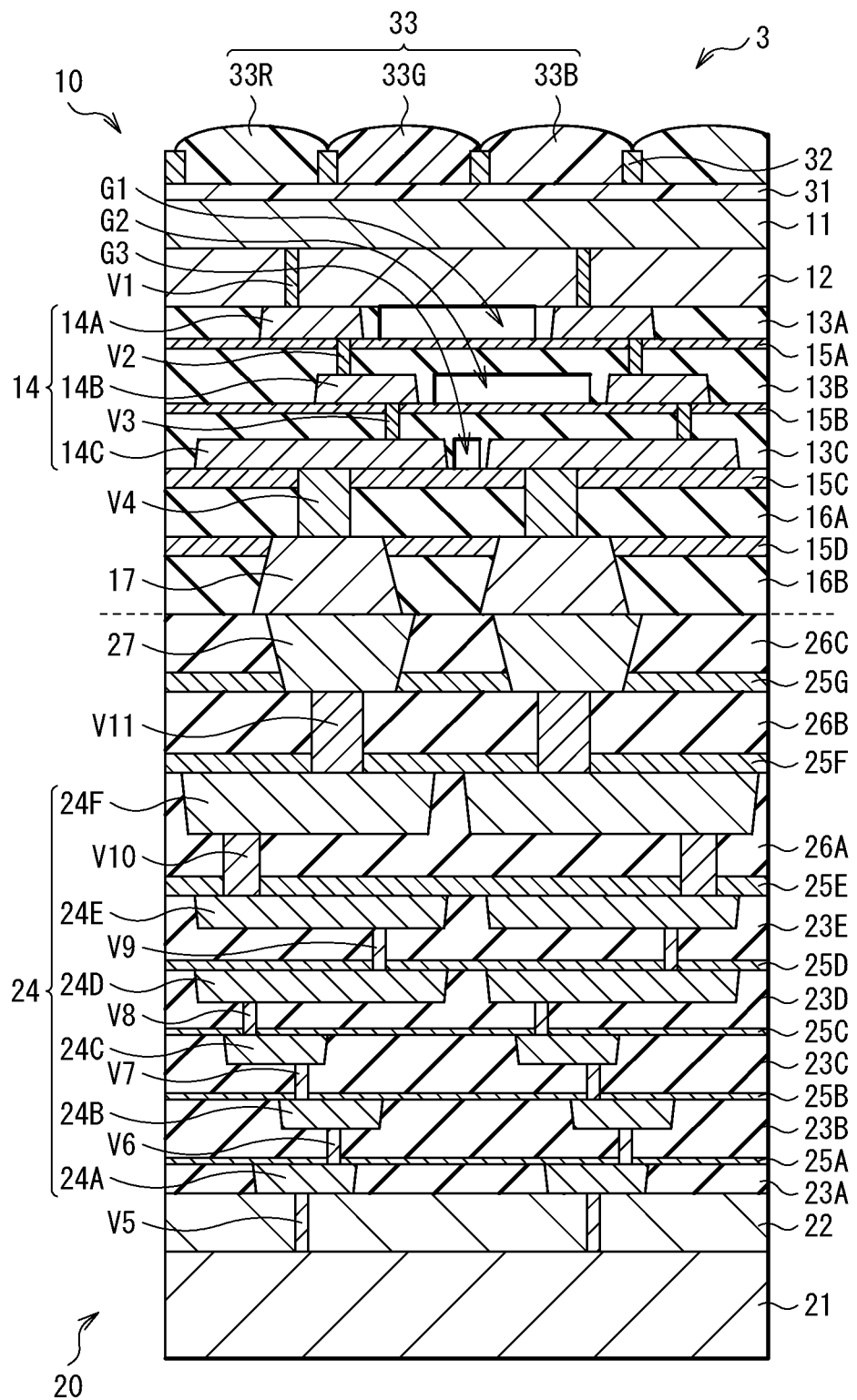
FIG. 5 is a cross-sectional schematic diagram illustrating a configuration of a semiconductor device according to a modification example 1 of the present disclosure.

FIG. 5 schematically illustrates a cross-sectional configuration of a semiconductor device (semiconductor device 3) according to a modification example 1 of the present disclosure. As with the semiconductor device 1 according to the above-described first embodiment, the semiconductor device 3 is obtained by joining a plurality of substrates (two substrates here) by CuCu junction. In the plurality of respective substrates, functional elements, various circuits, and the like are formed. The semiconductor device 3 according to the present modification example is different from the above-described first embodiment in that the interlayer insulating layers 13A, 13B, and 13C around the wiring lines 14A, 14B, and 14C included in the multilayer wiring layer 14 provided to the sensor substrate 10 are respectively provided with gaps G1, G2, and G3.

The gaps G1, G2, and G3 of the interlayer insulating layers 13A, 13B, and 13C are each formable by using the following method. For example, a predetermined region of the interlayer insulating layer 13A is removed by etching and is then pinched off, for example by chemical vapor deposition (Chemical Vapor Deposition; CVD) to allow the gap G1 to be formed in the interlayer insulating layer 13A. Alternatively, for example, the gap G1 may be formed in the interlayer insulating layer 13A by providing a through hole to the interlayer insulating layer 13B higher than the gap G1 and removing the interlayer insulating layer 13A by etching from the through hole. It is possible to form the gap G2 of the interlayer insulating layer 13B and the gap G3 of the interlayer insulating layer 13C by using similar methods.

As described above, in the present modification example, for example, the gaps G1, G2, and G3 are formed in the interlayer insulating layers 13A, 13B, and 13C each formed by using Low-k. This attains the effect of allowing the wiring delay to be further suppressed by providing a gap whose relative dielectric constant is lower than Low-k in addition to the effects of the above-described first embodiment.

It is to be noted that FIG. 5 illustrates examples of the pad portions 17 and 27 each formed by using a dual damascene wiring method, but this is not limitative. For example, the present modification example is also applicable to a semiconductor device including the pad portions 47 and 57 each formed by using a single damascene wiring method as in the semiconductor device 2 according to the second embodiment.

4. Modification Example 2

Figure 6:
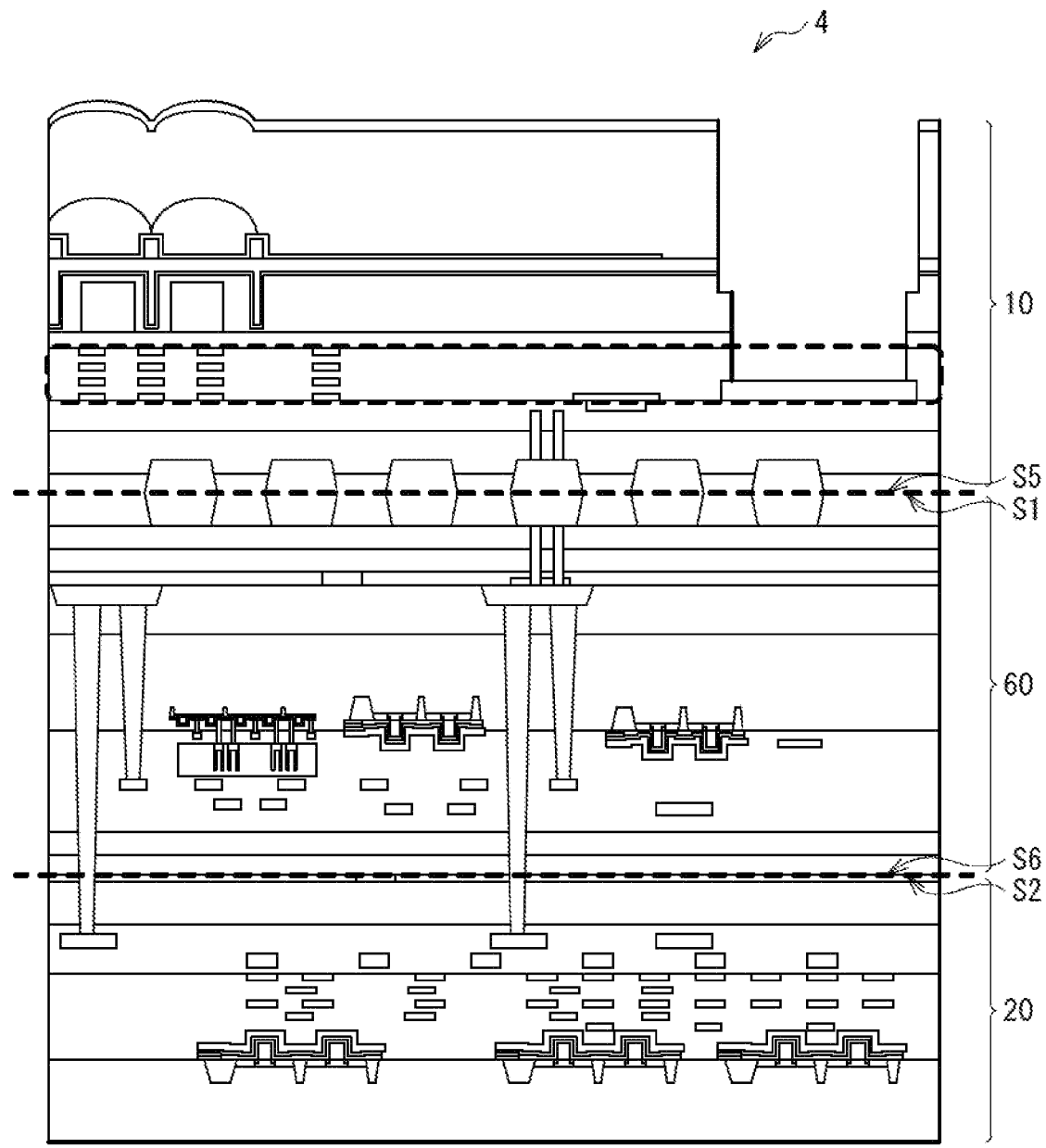
FIG. 6 is a cross-sectional schematic diagram illustrating an example of a configuration of a semiconductor device according to a modification example 2 of the present disclosure.

FIG. 6 schematically illustrates an example of a cross-sectional configuration of a semiconductor device (semiconductor device 4) according to a modification example 2 of the present disclosure. In the semiconductor device 4, a DRAM substrate 60 is stacked along with the sensor substrate 10 and the logic substrate 20. The semiconductor device 4 has a configuration in which the surface S1 of the sensor substrate 10 and a surface S5 of DRAM substrate are joined together by CuCu junction and the logic substrate 20 is joined to a surface S6 side opposed to the surface S5 of DRAM substrate 60. In this way, the substrate joined to the sensor substrate 10 described in the above-described first embodiment or the like is not limited, for example, to the logic substrate 20, but the sensor substrate 10 may be joined to another substrate such as the DRAM substrate 60.

Figure 7:
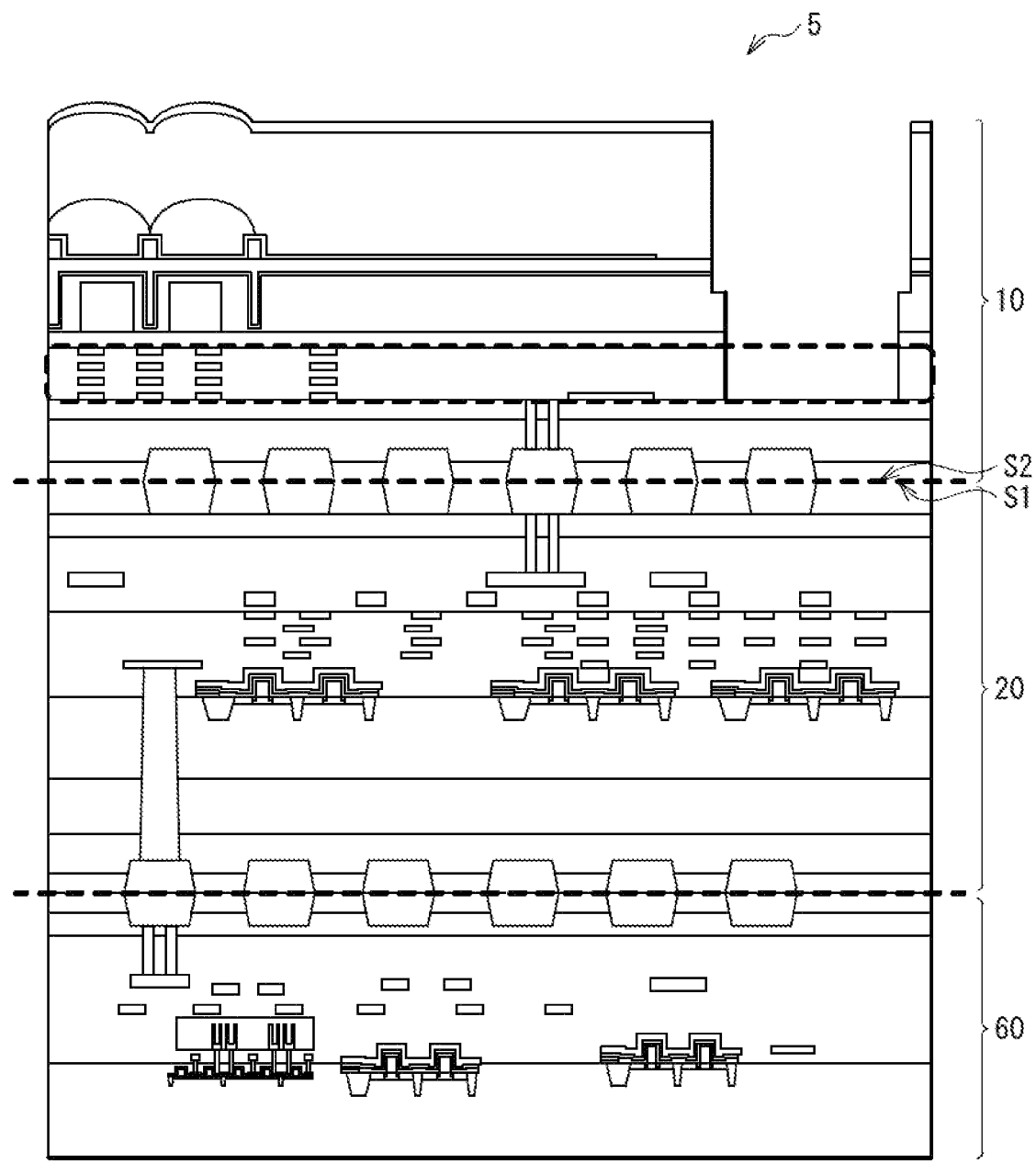
FIG. 7 is a cross-sectional schematic diagram illustrating another example of the configuration of the semiconductor device according to the modification example 2 of the present disclosure.

In addition, FIG. 6 illustrates an example in which the sensor substrate 10 and the DRAM substrate 60 are joined together by CuCu junction, but the sensor substrate 10 and the logic substrate 20 may be bonded together by using CuCu junction and the DRAM substrate 60 may be bonded to the other surface of the logic substrate 20, for example, as in a semiconductor device 5 illustrated in FIG. 7.

Figure 8:
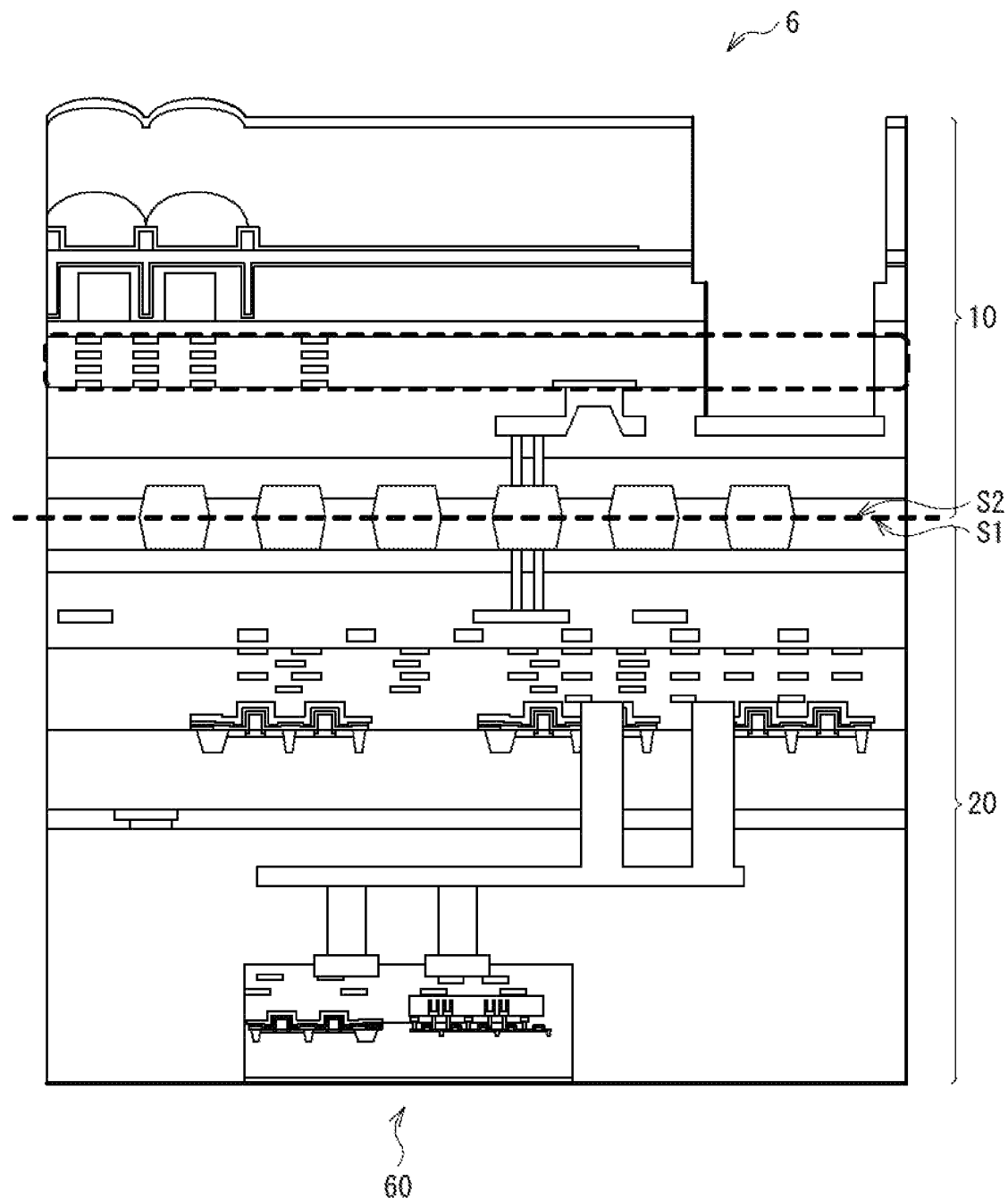
FIG. 8 is a cross-sectional schematic diagram illustrating another example of the configuration of the semiconductor device according to the modification example 2 of the present disclosure.

Further, the DRAM substrate 60 may be joined, for example, by using bump technology, to the sensor substrate 10 and the logic substrate 20 joined together by using CuCu junction as in a semiconductor device 6 illustrated in FIG. 8.

Although the present disclosure has been described above with reference to the first and second embodiments and the modification examples 1 and 2, the present disclosure is not limited to the above-described embodiments and the like and may be modified in a variety of ways. For example, in the above-described embodiments and the like, an example has been demonstrated in which a light receiving element including a photodiode is mounted as a functional element, but this is not limitative. A memory element or an antenna of a communication system may be mounted.

It is to be noted that the effects described in the present specification are merely illustrative and non-limiting, and there may be other effects. In addition, the present technology may have the following configurations.

(1)
A semiconductor device including:
a first substrate including a first junction portion; and
a second substrate including a second junction portion, the second junction portion being joined to the first junction portion, in which
the first substrate further includes a first multilayer wiring layer in which one surface of a first wiring line faces a first insulating layer and another surface opposed to the one surface is in contact with a second insulating layer, the first multilayer wiring layer being electrically coupled to the first junction portion via the first insulating layer, the first wiring line being formed closest to a junction surface with the second substrate, the second insulating layer having a lower relative dielectric constant than a relative dielectric constant of the first insulating layer.

(2)
The semiconductor device according to (1), in which the second insulating layer is formed by using a material having a relative dielectric constant of 1.5 or more and 3.8 or less.

(3)
The semiconductor device according to (1) or (2), in which the second insulating layer is formed by using a Low-k material.

(4)
The semiconductor device according to any of (1) to (3), in which the second insulating layer includes at least one of SiOC, SiOCH, porous silica, SiOF, inorganic SOG, organic SOG, or polyallyl ether.

(5)
The semiconductor device according to any of (1) to (4), in which the first insulating layer is formed by using a material having a relative dielectric constant of 4.0 or more and 8.0 or less.

(6)
The semiconductor device according to any of (1) to (5), in which the first insulating layer includes at least one of SiO, SiN, SiON, SiC, or SiCN.

(7)
The semiconductor device according to any of (1) to (6), in which the first multilayer wiring layer including the first wiring line is formed under a wiring rule of an L/S (line and space) of 120/120 mm or less.

(8)
The semiconductor device according to any of (1) to (7), in which
the first junction portion and the first wiring line are coupled through a via, and
the first junction portion and the via have a total film thickness of 1 μm or more.

(9)
The semiconductor device according to (8), in which the first junction portion and the via each have a dual damascene structure.

(10)
The semiconductor device according to (8), in which the first junction portion and the via each have a single damascene structure.

(11)
The semiconductor device according to any of (1) to (10), in which the first substrate further includes a functional element.

(12)
The semiconductor device according to (11), in which the functional element is a sensor element.

(13)
A method of manufacturing a semiconductor device, the method including:
forming, in order, a first multilayer wiring layer and a first junction portion to form a first substrate in which one surface of a first wiring line of the first multilayer wiring layer faces a first insulating layer and another surface opposed to the one surface is in contact with a second insulating layer, the first multilayer wiring layer including the second insulating layer as an interlayer insulating layer, the first junction portion having the first insulating layer around the first junction portion, the first wiring line being formed closest to the first junction portion, the second insulating layer having a lower relative dielectric constant than a relative dielectric constant of the first insulating layer; and
forming a second junction portion as a second substrate and then joining the first junction portion and the second junction portion together.

(14)
The method of manufacturing the semiconductor device according to (13), in which a via is formed by using a dual damascene wiring method, the via coupling the first junction portion and the first wiring line of the first multilayer wiring layer.

(15)
The method of manufacturing the semiconductor device according to (13), in which a via is formed by using a single damascene wiring method, the via coupling the first junction portion and the first wiring line of the first multilayer wiring layer.

This application claims the priority on the basis of Japanese Patent Application No. 2018-123927 filed with Japan Patent Office on Jun. 19, 2018, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

What is claimed is:
1. A semiconductor device, comprising:
a first substrate including a first junction portion; and
a second substrate including a second junction portion, the second junction portion being joined to the first junction portion,
wherein the first substrate further includes:
a first multilayer wiring layer in which one surface of a first wiring line faces a first insulating layer and another surface of the first wiring line opposed to the one surface of the first wiring line is in contact with a second insulating layer,
wherein the first insulating layer is provided between the first junction portion and the second insulating layer,
wherein the first multilayer wiring layer is electrically coupled to the first junction portion by a via of the first insulating layer, wherein the first wiring line is formed closest to a junction surface with the second substrate, and wherein the second insulating layer has a lower relative dielectric constant than a relative dielectric constant of the first insulating layer.

2. The semiconductor device according to claim 1, wherein the second insulating layer is formed by using a material having a relative dielectric constant of 1.5 or more and 3.8 or less.

3. The semiconductor device according to claim 1, wherein the second insulating layer is formed by using a Low-k material.

4. The semiconductor device according to claim 1, wherein the second insulating layer includes at least one of SiOC, SiOCH, porous silica, SiOF, inorganic SOG, organic SOG, or polyallyl ether.

5. The semiconductor device according to claim 1, wherein the first insulating layer is formed by using a material having a relative dielectric constant of 4.0 or more and 8.0 or less.

6. The semiconductor device according to claim 1, wherein the first insulating layer includes at least one of SiO, SiN, SiON, SiC, or SiCN.

7. The semiconductor device according to claim 1, wherein the first multilayer wiring layer including the first wiring line is formed under a wiring rule of an L/S (line and space) of 120/120 mm or less.

8. The semiconductor device according to claim 1, wherein the first junction portion and the first wiring line are coupled through a via, and the first junction portion and the via have a total film thickness of 1 μm or more.

9. The semiconductor device according to claim 8, wherein the first junction portion and the via each have a dual damascene structure.

10. The semiconductor device according to claim 8, wherein the first junction portion and the via each have a single damascene structure.

11. The semiconductor device according to claim 1, wherein the first substrate further includes a functional element.

12. The semiconductor device according to claim 11, wherein the functional element is a sensor element.

13. A method of manufacturing a semiconductor device, the method comprising:

forming, in order, a first multilayer wiring layer and a first junction portion to form a first substrate in which one surface of a first wiring line of the first multilayer wiring layer faces a first insulating layer and another surface of the first wiring line opposed to the one surface of the first wiring line is in contact with a second insulating layer, wherein the first insulating layer is provided between the first junction portion and the second insulating layer, wherein the first multilayer wiring layer includes the second insulating layer as an interlayer insulating layer, wherein the first junction portion includes the first insulating layer around the first junction portion, wherein the first wiring line is formed closest to the first junction portion, and wherein the second insulating layer has a lower relative dielectric constant than a relative dielectric constant of the first insulating layer;

forming a second junction portion as a second substrate; and joining the first junction portion and the second junction portion together.

14. The method of manufacturing the semiconductor device according to claim 13, wherein a via is formed by using a dual damascene wiring method, the via coupling the first junction portion and the first wiring line of the first multilayer wiring layer.

15. The method of manufacturing the semiconductor device according to claim 13, wherein a via is formed by using a single damascene wiring method, the via coupling the first junction portion and the first wiring line of the first multilayer wiring layer.

16. The method of manufacturing the semiconductor device according to claim 13, wherein the second insulating layer is formed by using a material having a relative dielectric constant of 1.5 or more and 3.8 or less.

17. The method of manufacturing the semiconductor device according to claim 13, wherein the second insulating layer is formed by using a Low-k material.

18. The method of manufacturing the semiconductor device according to claim 13, wherein the second insulating layer includes at least one of SiOC, SiOCH, porous silica, SiOF, inorganic SOG, organic SOG, or polyallyl ether.

19. The method of manufacturing the semiconductor device according to claim 13, wherein the first insulating layer is formed by using a material having a relative dielectric constant of 4.0 or more and 8.0 or less.

20. The method of manufacturing the semiconductor device according to claim 13, wherein the first insulating layer includes at least one of SiO, SiN, SiON, SiC, or SiCN.

* * * * *